(12) United States Patent
Kelsey

(10) Patent No.: US 6,232,785 B1
(45) Date of Patent: May 15, 2001

(54) PORTABLE MICROPHONE/SPEAKER FOR AUDIO SIGNAL LINE TESTING

(75) Inventor: James G. Kelsey, Hilton, NY (US)

(73) Assignee: Whirlwind Music Distributors, Inc., Rochester, NY (US)

( * ) Notice: Subject to any disclaimer, the term of this patent is extended or adjusted under 35 U.S.C. 154(b) by 0 days.

(21) Appl. No.: 09/086,140

(22) Filed: May 28, 1998

(51) Int. Cl.[7] ................................................ G01R 31/08
(52) U.S. Cl. .................... 324/527; 511/542; 511/555; 381/59
(58) Field of Search ................ 381/58, 109, 75, 381/59; 324/555, 542, 546, 527, 508, 511

(56) References Cited

U.S. PATENT DOCUMENTS

| | | | |
|---|---|---|---|
| 4,415,778 | * | 11/1983 | Turner ........................................ 379/8 |
| 4,670,709 | * | 6/1987 | Iredale ................................. 324/73 R |
| 4,788,708 | * | 11/1988 | Hendrix ...................................... 379/6 |
| 5,400,406 | * | 3/1995 | Heline, Jr. et al. ...................... 381/58 |
| 5,887,051 | * | 3/1999 | Sullivan et al. ......................... 379/21 |

* cited by examiner

Primary Examiner—Forester W. Isen
Assistant Examiner—Brian Pendleton
(74) Attorney, Agent, or Firm—Shlesinger, Fitzsimmons & Shlesinger

(57) ABSTRACT

The device includes a housing containing a dc battery, a microphone, an audio tone signal source, and a speaker and headphone jack which can receive audio signals from either the microphone or the tone signal source, and two multi-pin XLR receptacles or jacks, one of which is male and the other of which is female. The connectors can supply audio signals from the microphone or tone signal source to the input of the speaker and headphone jack, or alternatively, such signals can be outputted by the male connector to a circuit external of the housing, or a source external to the housing can be utilized to supply audio signals via the male or female connector to the speaker. Power from the battery is supplied selectively either to the microphone or to the tone signal source by a switch which can be moved to either of two different operative positions, or by a volume control knob which applies power to the speaker circuits. A headphone plug can be inserted into the headphone jack to supply audio signals to a set of headphones rather than to the speaker.

12 Claims, 2 Drawing Sheets

PORTABLE MICROPHONE/SPEAKER FOR AUDIO SIGNAL LINE TESTING

BACKGROUND OF THE INVENTION

Figure 1:
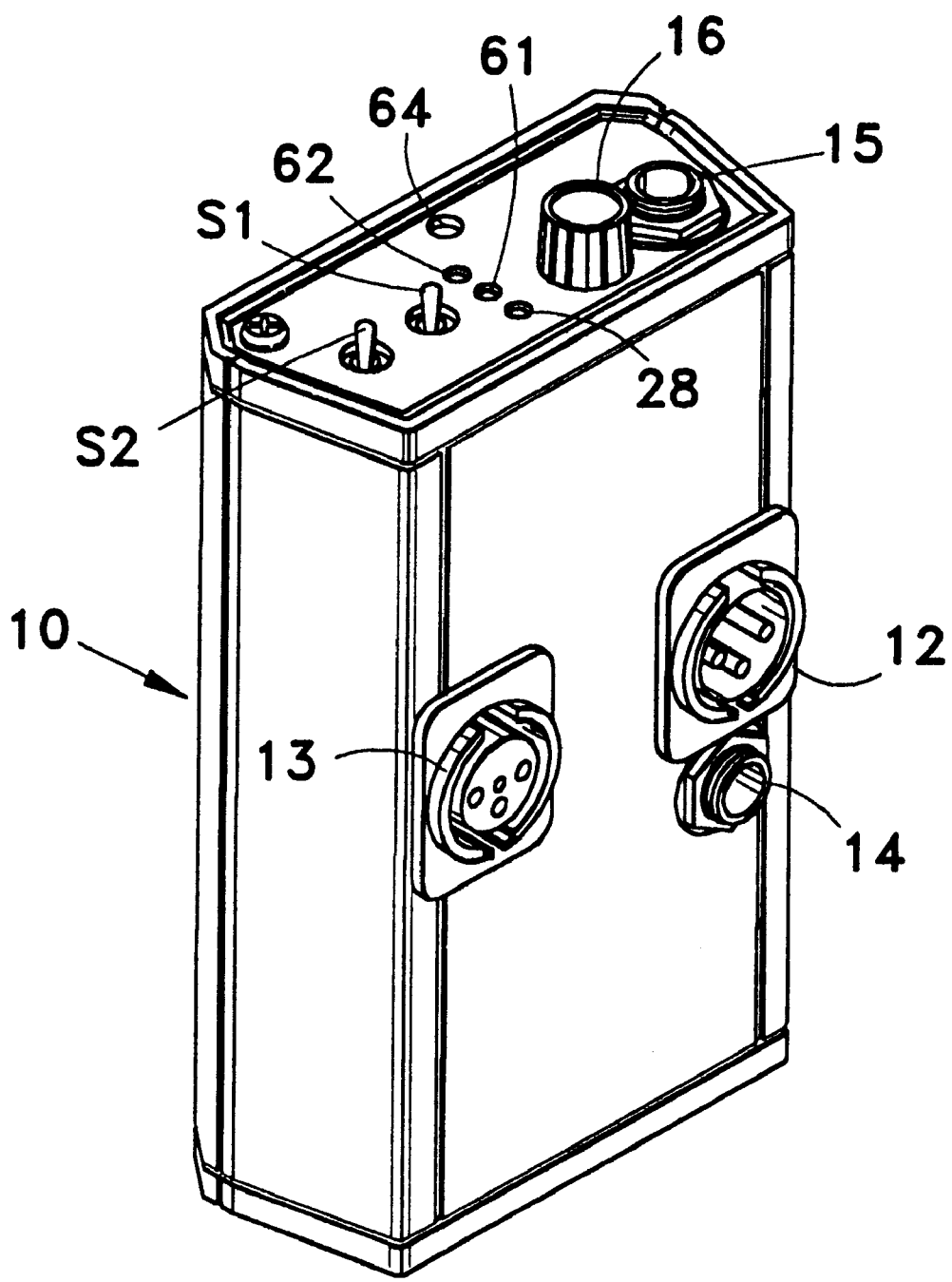

This invention relates to audio signal line testing devices, and more particularly a portable microphone/speaker device capable of monitoring or troubleshooting such lines during installation thereof. Even more particularly this invention relates to a device of the type described which is capable also of sensing the presence of phantom or intercom power during such installation proceedings.

One of the procedures necessary during the installation of audio communication systems is to make sure that the various lines that are installed to carry the audio signals are properly installed or connected, so that communications between various points in the system can be achieved as desired. Therefore, before the system is placed in use it is customary to test or troubleshoot the various signal lines to make sure that the signals are properly transmitted between the various points in the desired manner. By way of example, during a nationally televised golf tournament, or the like, numerous audio signal lines or cables must be laid throughout the course to enable communication between various stations (for example video camera stations and the like) spaced throughout the course. As a consequence, when the various cables are laid or installed, they must be tested to make sure that they are properly connected.

Currently there are available in the marketplace rather complicated and large pieces of equipment which can be employed for testing the ability of such cables to properly carry audio signals. Most such current equipment, however, is not only rather costly, but also is rather cumbersome and difficult to transport to the various stations from which tests must be conducted.

It is an object of this invention, therefore, to provide a relatively simple and small portable device or box which can be readily carried by an individual for use in testing the various lines or cables of an audio signal system of the type described.

A more specific object of this invention is to provide a combined microphone/speaker box or device which is of the hand-held variety, and which can be employed to test audio signal lines or cables of the type described for any ring proper connections and also for checking such lines for phantom power or intercom power.

Still a further object of this invention is to provide a portable device of the type described which can be releasably connected to a conventional headphone so that each of two such devices can be located at different stations in an audio system to enable two way communication via the associated headphones rather than via the device's speaker.

Other objects of the invention will be apparent hereinafter from the specification and from the recital of the appended claims, particularly when read in conjunction with the accompanying drawings.

SUMMARY OF THE INVENTION

A small housing contains a battery, microphone, a tone signal source and a speaker for receiving audio signals from either the microphone or the tone signal source. A first switch is movable from an inoperative position in which it deenergizes the microphone and tone signal source, selectively to either of two operative positions in which it energizes either the microphone or the tome signal source. Power to the speaker circuit is provided with a second switch incorporated in the volume control knob. When the volume control knob is rotated fully counterclockwise the switch is open. In any other position the switch is closed, supplying power to the speaker circuit.

The respective outputs of the microphone and tone signal source are connected directly and in parallel to one pin each of two, multi-pin audio signal connectors that are mounted on the housing, and indirectly through two separate inverter circuits, the outputs of which are connected in parallel to one other pin of each of the two audio signal connectors. The above-noted pins are utilized for supplying audio signals to the input of the speaker, or alternatively, the two multi-pin connectors, one of which is male and the other female, can be utilized for transmitting audio signals to a circuit external to the housing, or to receive audio signals from a source external to the housing. Attenuating circuits which are interposed between the multi-pin connectors and the microphone and tone signal source can be utilized for attenuating the differential signals produced by, respectively, the microphone and its inverter circuit, and the tone signal source and its inverter circuit.

THE DRAWINGS

Figure 2:
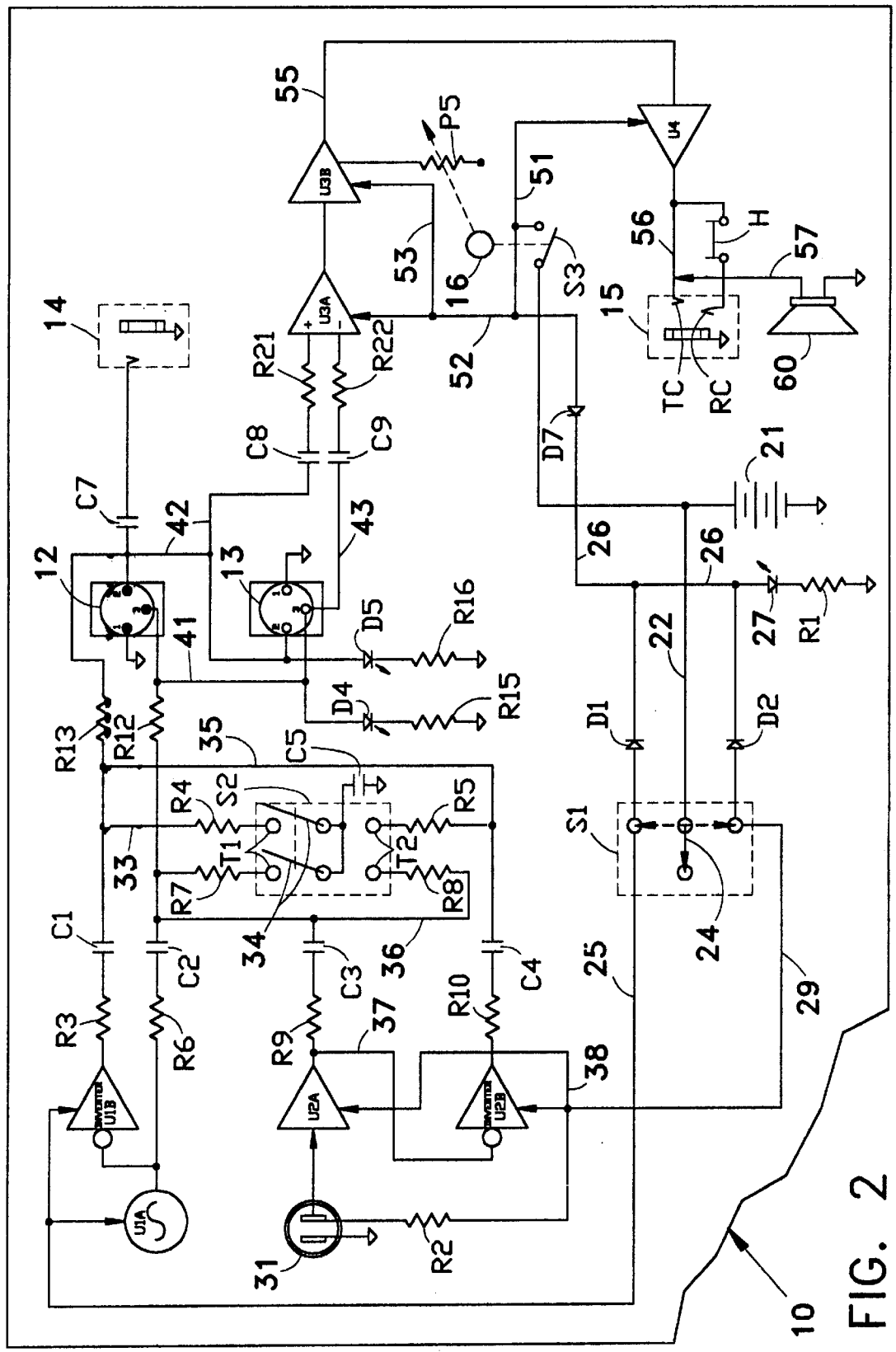

FIG. 1 is a perspective view showing the front, one side of the top of a portable microphone/speaker for audio signal line testing made according to one embodiment of this invention; and FIG. 2 is a block wiring diagram showing the circuits mounted in portable microphone/speaker shown in FIG. 1.

DETAILED DESCRIPTION OF THE PREFERRED EMBODIMENTS

Referring now to the drawings by numerals of reference, and first to FIG. 1, 10 denotes generally the housing of a microphone/speaker device having mounted on its front face, adjacent opposite sides thereof conventional audio connectors or receptacles 13 and 12 forming, respectively, female signal input and male signal output XLR jacks of the known, three-pin variety. Also mounted on the front face of the housing 10 adjacent receptacle 12 is a tip sleeve jack 14, the purpose of which will be noted in greater detail hereinafter.

Mounted on the top of housing 10 adjacent one side thereof (the right side as shown in FIG. 1) is a receptacle 15 for accommodating a headphone jack which can be employed with the device as noted hereinafter. Adjacent receptacle 15 is a manually operable volume control knob 16 which as noted hereinafter is utilized selectively to provide power and control volume to a speaker/headphone circuit. When the knob 16 is rotated to its fully counterclockwise position the volume control is in its off position. Other items located on the top wall of the housing 10 will be described in greater detail hereinafter.

Referring now to FIG. 2, housing 10 contains a nine volt battery 21 the positive terminal of which is connected by a line 22 to a three-position, manually operable switch S1 (FIGS. 1 and 2) having a single pole or contact 24 pivotal between a central, OFF position as shown by a solid line in FIG. 2, and selectively into one of two different operative positions in which the contact is shown in phantom by broken lines in FIG. 2. In one such operative position, its tone position, contact 24 connects line 22 to a line 25 which is used to supply power to a tone circuit, as noted hereinafter, and which also is connected through a diode D1, a line 26 and a light emitting diode (LED) 27 to ground. When diode 27 is energized, it is designed to emit red light through an opening 28 formed in the upper wall (FIG. 1) in the housing 10. When switch contact 24 is moved to its other operative position, which is referred to as its "mic" position it connects line 22 through another diode D2 and the LED 27 to ground, and through another line 29 and resistor R2 to supply power to one terminal of a conventional, internal microphone 31, the other terminal of which is grounded. Microphone 31 is a conventional Electret mic element sold by Panasonic as part number WM-034CY195, and is mounted in a stationary position in housing 10.

When toggle switch S1 is in its tone position to connect line 22 to line 25, line 25 supplies power to an oscillator circuit U1A, which may be an integrated circuit of the type sold for example by Texas Instruments as TL062, or equivalent. This circuit, when powered, produces at its output a 440 Hz sine wave at +4dBm, which constitutes the "tone" which the device is intended to produce for a purpose noted hereinafter. Line 25 also supplies power to the low power amplifier of an oscillator inverter circuit U1B, which receives the output sine wave signal from the oscillator circuit U1A, and which also receives power via line 25. This inverter circuit causes the input sine wave signal from circuit U1A to be inverted or placed 180° out of phase, thereby producing a balanced or differential signal, when used with the original in phase signal.

When the oscillator circuit U1A and the inverter circuit U1B are energized, the output of the inverter circuit U1B is applied through a resistor R3, a capacitor C1, line 33 and a resistor R4 to one of two spaced terminals T1 that form one operating position of another three-position toggle switch S2. Switch S2, which forms part of an attenuation circuit, has a pair of interconnected, double pole switch contacts 34 movable manually between a first operative position in which they engage the terminals T1 of switch S2, a second operative position in which they engage two other spaced terminals T2 of the switch, and an intermediate, OFF position, as shown in FIG. 2, wherein the contacts 34 engage neither set of terminals T1 or T2. Referring further to the output of the inverter circuit U1B, it is connected also by a line 35, and through a resistor R5 with one of the other two terminals T2 of the switch S2. Also as shown in FIG. 2, the output of oscillator circuit U1A, in addition to being applied to the input of the inverter circuit U1B, is applied through a resistor R6 and capacitor C2, and through a resistor R7 to the other of the two switch terminals T1 and through a line 36 and resistor R8 to the other terminal T2 of switch S2.

On the other hand, when power from the battery 21 is supplied to line 29, rather than to line 25, the now-energized microphone 31 produces a low level audio output signal which is applied to the input of an amplifier circuit U2A, the output of which has approximately +30 dBm of gain. The output signal is applied by a line 37 to the input of another inverter circuit U2B for a 180° phase inversion thereby. At this time both circuits U2A and U2B are receiving power from the battery 21 via a line 38 which is connected to the line 29. The in-phase output signal of the amplifier circuit U2A is also applied through a resistor R9, a capacitor C3 and line 36 to one each of the terminals T1 and T2 of the attenuation circuit switch S2. Also at this time the output of the inverter circuit U2B is applied through a resistor R10 and a capacitor C4 to the other of the terminals T2, and through the line 35 to the other of the terminals T1 of the switch S2.

When switch S2 is in its OFF position as shown in FIG. 2, and assuming that the oscillator circuit U1A and inverter circuit U1B have been energized, then the +4 dBm output of U1A, in addition to being applied to one each of the terminals T1 and T2 of the switch S2, will be applied through resistor R12 and in parallel by line 41 to one pin each (pins 3 as shown in FIG. 2) of the XLR connectors 12 and 13. At the same time the output of the inverter U1B would be applied through a resistor R13 and parallel by a line 42 to one other pin terminal (identified by numeral 2 in FIG. 2) of each of the XLR connectors 12 and 13. As shown in FIG. 2, lines 41 and 42 are also connected, respectively, through an LED D4 and resistor R15, and an LED D5 and resistor R16 to ground.

On the other hand, it will be noted also that the output of the microphone 31, which outputs an average audio level of +4 dBm in response to normal talk, is applied by line 36 to the junction between capacitor C2 and the resistor R12, so that when the microphone is energized its output is likewise applied in parallel by line 41 to the same pin terminals of the XLR connectors 12 and 13 which would receive the output of the oscillator circuit U1A were the latter to be energized. Also, it will be noted in FIG. 2 that the output of the inverter circuit U2B is connected via line 35 to the juncture between the capacitor C1 and the resistor R13, so that when microphone 31 is energized, rather than oscillator U1A, the output of U2B is applied in parallel by line 42 to the two terminal pins of connectors 12 and 13 which are disposed to receive the output of U1B, when the latter is energized. Thus, either of the parallel connected audio connectors 12 or 13 may be utilized to output from housing 10 the tone signal, or the output of the microphone 31.

Under certain circumstances it may be desirable to attenuate the audio output signal from the "tone" circuit (U1A and U1B energized) or the output of the microphone 31 when it is energized. For this purpose the switch S2, the pivotal contacts of which are connected together and through a capacitor C5 to ground, may be swung to a first operating position in which they engage the terminals T1, in which case switch S2 attenuates the incoming differential audio signal from a +4 dBm to a −20 dBm. On the other hand, when the switch contacts 34 are swung into engagement with the terminals T2, the incoming differential audio signal is attenuated to a −50 dBm.

The above-noted tip sleeve jack 14, which opens on the face of housing 10 as shown in FIG. 1, is shown also in FIG. 2 to be coupled by a capacitor C7 to line 42, and hence is AC coupled to the pins 2 of the XLR connectors 12 and 13 for a purpose noted hereinafter. The audio signals applied to pins 2 of connectors 12 and 13 are connected by wire 42 through a capacitor C8 and resistor R21 to one input of a differential input amplifier U3A which forms part of a volume control circuit. Likewise the pins 3 of connectors 12 and 13 are connected via line 41, a line 43, a capacitor C9 and resistor R22 with the other input to the amplifier of the U3A circuit. Power is supplied to the circuit U3A through a switch S3, which is controlled by the above-noted volume control knob 16 (FIG. 1). As shown in FIG. 2, knob 16 is illustrated in the position corresponding to its above-noted fully counterclockwise position in which it has caused switch S3 to be opened. However, the moment knob 16 is rotated out of its full, counterclockwise position, it effects the closure of switch S3, and for a purpose noted hereinafter, begins to adjust a potentiometer P5 to which it is coupled.

When switch S3 is closed, battery power is supplied from line 22 through switch S3 to line 51, which in turn supplies power through a diode D7 to line 26 in order to energize the LED 27. Also at this time line 51 supplies power through line 52 to the U3A circuit, and through line 53 to energize the volume control amplifier U3B. When energized, the output of U3A is supplied to the input of amplifier U3B; and the output of U3B is applied by a line 55 to the input of a speaker/headphone amplifier circuit denoted in the drawing as U4, and which corresponds to the National Semiconductors Part No. LM386. The output of circuit U4 is connected through a removable header switch H to the ring contact RC of the receptacle 15 for the headphone jack, and through a line 56 with the tip contact TC of receptacle 15. When the headphone plug is not mounted in the receptacle 15, the tip contact TC normally permits the line 56 to remain connected to a line 57 to deliver the audio signal from circuit U4 to a speaker 60 (e.g. a 2.25'8 ohm 0.2 watt) that is secured in housing 10. On the other hand, when the headphone plug (not illustrated) is inserted into receptacle 15, the tip contact TC is moved, causing line 56 to become disengaged from line 57, thereby disconnecting Speaker 60 from the U4 circuit, and instead permitting its audio signal to be delivered to the headphone jack.

In use, the device can be turned on in three ways: by placing switch S1 in one of its two operative positions, or by closing switch S3. When the movable contact 24 of switch S1 is in either of its operative positions, or whenever switch S3 is closed, the LED 27 will be energized, thereby causing red light to be emitted through the opening 28 in housing 10. Also, since the pins 2 and 3 Of the XLR connectors 12 and 13 are always connected through, respectively, the LED's D5 and D4, these LED's will be energized whenever any positive dc voltage greater than 5 volts dc is on a particular cable attached to the connector 12 or 13. Diode D5 registers with an opening 62 on the top of housing 10 through which green light is emitted when D5 is energized; and D4 registers with an opening 61 in the top of housing 10 which emits yellow light when diode D4 is energized. The top of housing 10 has therein a further opening 64 which is intended to permit audio sounds to be delivered to the microphone 31 in housing 10, when the microphone is energized. The microphone is omnidirectional so it picks up most sounds within approximately ten feet of the housing 10, so it is not required to talk directly into the opening 64. More importantly, however, since opening 64 communicates directly with the interior of housing 10, it is very important to cover the opening 64 with tape or the like, when the device is employed in the rain or snow, or in any condition in which moisture might readily enter through opening 64 to the interior of housing 10.

In practice the output impedances of the microphone 31 or tone U1A is set high in all three positions of switch S2, so that the minimum output impedance is 940 ohms, so that it does not unnecessarily load down any other paralleled input, such as another microphone which might be connected to the XLR connector 13. In this way a two-way intercom feature may be utilized, with audio signals being sent and received on the same differential line. The speaker amplifier circuit U4 provides a monoral signal which, as noted in FIG. 2, normally is applied to both earpieces on a standard plug or jack, and will drive both headphones. Since some earpieces, however, are of the Tip Sleeve variety (rather than Tip Ring Sleeve), it is necessary to remove the signal from the ring (RC) terminal of the receptacle 15. For this purpose housing 10 is provided with a removable back panel which permits one to remove the header H from the circuit in those instances in which a Tip Sleeve type of earpiece is employed.

From the foregoing it will be apparent that the present invention provides an extremely compact, portable device which is capable of functioning as a microphone, tone generator speaker and dc sense indicator to check or test audio signal lines or cables with proper ring connections and for detecting any phantom power or intercom power on the lines. For example, the signal source section of the device, by virtue of switch S1, enables a test signal to be sent down an audio line either from the tone source U1A, or from the microphone 31. Moreover, switch S2 functions to permit such test signal to remain at +4 dBm, or can be manipulated manually to be attenuated to either −20 dBm or −50 dBm. Moreover such device is capable of enabling two-way communication via headphones, rather than the internal speaker of the device, if desired.

While this invention has been illustrated and described in connection with only certain embodiments thereof, it will be apparent to one skilled in the art that it is capable of still further modification, and that this application is intended to cover any such modifications that may fall within the scope of one skilled in the art or the appended claims.

What is claimed is:

1. A portable audio signal testing device, comprising a housing having a signal input receptacle for receiving audio signals from a source externally of said housing, and a signal output receptacle for transmitting audio signals from said housing, a microphone mounted in said housing, a receptacle for headphone jack in said housing, an audio tone signal source in said housing, means for selectively energizing either said microphone or said tone signal source to produce an analog audio signal at an output thereof, a speaker mounted in said housing and having a signal input, and control means operable selectively to energize said speaker and to apply audio signals from either the output of the energized tone signal source or microphone, or from said signal input receptacle to the input of said speaker.

2. A portable audio signal testing device as defined in claim 1, wherein said control means further comprises a pair of multi-pin signal connectors with the pins of one of said connectors connected in parallel with the pins of the other of said connectors and with the outputs of said microphone and said signal source, and said device is operable to transmit signals from said output receptacle while receiving signals from an external source at said input receptacle.

3. A portable audio signal testing device as defined in claim 2, including means operative upon placement of a headphone jack in said receptacle to interrupt said signal input of said speaker.

4. A portable audio signal testing device as defined in claim 1, wherein said control means further includes a volume control circuit including a manually-operable knob rotatable in one direction to increase the volume of the output of said speaker, and a switch connected to said knob and operative to be disposed in a closed position to supply power to said speaker when said knob is rotated in said one direction, and operative to be opened to interrupt power to said speaker when said knob is rotated as far as possible in the opposite direction.

5. A portable audio signal testing device as defined in claim 4, wherein said control means further includes a signal sensor operative to produce a visible signal whenever said switch is closed by said knob.

6. A portable audio signal testing device as defined in claim 1, including an opening in said housing communicating with the input to said microphone to permit audio sounds to be delivered to said microphone from the exterior of said housing.

7. A portable audio signal testing device, comprising a housing, a microphone mounted in said housing, an audio tone signal source ins aid housing, means for selectively energizing either said microphone or said tone signal source to produce an analog signal at an output thereof, a signal connector including a pair of pins connected, respectively, to the output of said microphone and to the output of said tone signal source to receive the audio signals produced thereby, a speaker mounted in said housing and having a signal input, means interposed between said signal connector and said speaker and operative selectively to energize said speaker and to apply audio signals from said pair of pins to the input of said speaker, a further signal connector each of said connectors comprising a pair of multi-pin signal connectors, each of said connectors having a first pin thereof forming one of said pair of pins, means connecting said pair of pins in parallel to the output of said microphone and to the output of said signal source, a pair of signal inverter circuits each having a signal input and a signal output, the input of one of said circuits being connected to the output of said microphone, and the input of the other of said circuits being connected to the output of said signal source, and means connecting a second pin in each of said signal connectors in parallel to the outputs of said pair of signal inverter circuits.

8. A portable audio signal testing device as defined in claim 7, wherein said speaker operating means includes, a differential input amplifier circuit having one input connected to said first pins of said pair of signal connectors, and a second input connected to said second pins of said signal connectors, and means connected to the output of said amplifier and adjustable manually to adjust the amplitude of the audio signals applied to the input of said speaker thus to adjust the volume of the speaker output.

9. A portable audio signal testing device as defined in claim 7, wherein said signal connectors are of the XLR variety, one of said connectors being a female signal input connector for selectively supplying audio signals to said first and second pins of said connectors, and the other being a male signal output connector for outputting audio signals originating from said microphone or said tone signal source.

10. A portable audio signal testing device as defined in claim 4, including a pair of signal attenuation circuits having two sets of spaced terminals, the signal outputs of said microphone and said signal source being connected in parallel to one terminal of each of said two sets thereof, and the outputs of said inverter circuits being connectd in parallel to the other terminal of each of said two sets thereof, and a pair of manually operable switch contacts movable in unison from an inoperative position and selectively to a first operative position in which said contacts interconnect the two terminals of one of said sets to connect one of said attenuation circuits thereto, and to a second operative position in which said contacts interconnect the two terminals of the other of said sets to connect the other of said attenuation circuits thereto.

11. A portable audio signal testing device as defined in claim 7, including a pair of signal sensors connected to said first and second pins in each of said connectors and disposed to be energized whenever a signal of predetermined value appears on any of said first and second pins, and means producing a visible signal each time either of said sensors is energized.

12. A portable audio signal testing device as defined in claim 7, wherein said means for selectively energizing said microphone or signal source includes means for producing a visible signal each time either of said microphone and signal source is energized.

* * * * *